(12) United States Patent
Camp

(10) Patent No.: US 8,384,553 B2
(45) Date of Patent: Feb. 26, 2013

(54) TRIGGER MECHANISM

(75) Inventor: Warwick Jonathan David Camp, Somerset (GB)

(73) Assignee: Becatech Systems Limited, Cheddar Somerset (GB)

( * ) Notice: Subject to any disclaimer, the term of this patent is extended or adjusted under 35 U.S.C. 154(b) by 459 days.

(21) Appl. No.: 12/715,441

(22) Filed: Mar. 2, 2010

(65) Prior Publication Data

US 2011/0215939 A1 Sep. 8, 2011

(51) Int. Cl.
*G08B 21/00* (2006.01)
(52) U.S. Cl. ........................................ 340/654
(58) Field of Classification Search .......... 340/654, 340/568.2, 541, 545.4; 333/236, 245
See application file for complete search history.

(56) References Cited

U.S. PATENT DOCUMENTS

| | | | |
|---|---|---|---|
| 3,867,564 A | 2/1975 | Kardashian | |
| 3,932,718 A * | 1/1976 | Porat | 200/61.93 |
| 4,401,980 A * | 8/1983 | Rittenbach et al. | 340/666 |
| 4,887,069 A | 12/1989 | Maki et al. | |
| 5,247,270 A * | 9/1993 | Harman et al. | 333/237 |
| 5,473,336 A | 12/1995 | Harman et al. | |
| 5,705,984 A | 1/1998 | Wilson | |
| 6,577,236 B2 * | 6/2003 | Harman | 340/552 |
| 6,583,721 B1 * | 6/2003 | Dank et al. | 340/548 |

FOREIGN PATENT DOCUMENTS

| | | |
|---|---|---|
| DE | 1910780 A1 | 9/1976 |
| DE | 1967221 B1 | 9/1980 |
| DE | 3338936 A1 | 5/1985 |

* cited by examiner

*Primary Examiner* — Phung Nguyen
(74) *Attorney, Agent, or Firm* — Hultquist, PLLC; Mary B. Grant; Steven J. Hultquist

(57) ABSTRACT

A trigger mechanism including sensing electronics, a power source and a length of bifilar wire. The bifilar wire has two electrically conductive filaments separated by an insulator, with a first end in electrical connection with the sensing electronics and the power source and a second end that is free. A circuit can be created by fusing together the two filaments in a section of the bifilar wire. The sensing electronics are configured to monitor the status of a circuit created between the bifilar wire, sensing electronics and power source and to output a signal when the circuit is broken.

35 Claims, 4 Drawing Sheets

TRIGGER MECHANISM

FIELD

The present invention relates to a trigger mechanism, in particular for detecting intrusion into a secure area.

BACKGROUND

It is desirable in both military and civilian settings to protect boundaries. In particular, it is desirable for security to be notified when intruders cross boundaries. For example, intruder detection is important in a military "safe zone" or to detect gate crashers in events such as music festivals and open air concerts.

One type of trigger mechanism used in military applications uses a trip wire under tension. Release of the tension in the trip wire causes activation in the trigger mechanism, for example by pulling out a pin in the mechanism. A disadvantage of this known type of trigger mechanism is that the use of trip wire under tension enables detection.

SUMMARY

The present invention relates to a trigger mechanism having utility for detecting intrusion into a secure area A first aspect of the present invention provides a trigger mechanism comprising:
sensing electronics;
a power source;
a length of bifilar wire comprising two electrically conductive filaments separated by an insulator, the bifilar wire having a first end in electrical connection with the sensing electronics and the power source and a second end which is free;
wherein the sensing electronics are configured to monitor the status of a circuit created between the bifilar wire, sensing electronics and power source when two filaments of the bifilar wire are fused or joined together at a section along the length of the bifilar wire.

This arrangement allows an electrical circuit to be created with a linear wire.

The bifilar wire may be wound in a coil. The two filaments in the bifilar wire may comprise metallic filaments. The two filaments may comprise either similar or dissimilar metals.

At least one filament of the bifilar wire may comprise copper.

The two filaments may be capable of being fused together by direct heat, such as a soldering iron or blow torch. In one embodiment the two filaments of the bifilar wire are capable of being fused together by a naked flame, for example a match or lighter.

Alternatively, the two filaments may be capable of being joined together by mechanical means, for example by an insulation displacement connection (IDC).

The two filaments may be separated by insulation. The insulation may comprise vaporizable insulation. Examples of suitable insulation include shellac, polyurethane or other insulating varnish. In the case where the two filaments are to be joined by an insulation displacement connection, there is no advantage in using a vaporizable insulation.

A fine gauge length of bifilar wire is used, although the gauge of wire selected will depend on what the trigger mechanism is being used to detect, for example detection of unauthorized personnel or vehicles will require different gauge wires. The bifilar wire may have a gauge, as measured in British Imperial Standard Wire Gauge ("SWG") units, of 30 SWG (=0.0124 inch=0.315 mm) or above. The bifilar wire may have a gauge of 30-50 SWG (0.0124-0.001 inch; 0.315-0.025 mm). In one embodiment, the bifilar wire has a gauge of 47 SWG (=0.002 inch=0.051 mm). The bifilar wire may have a length of at least 1 km (=.0.62 mile).

The trigger mechanism may further comprise a transmitter for transmitting a signal on breakage of the circuit between the bifilar wire, sensing electronics and power source.

The trigger mechanism may further comprise a housing, wherein the housing houses the power source and sensing electronics. The housing may house a spool for the bifilar wire. An electrical connection between the spool and housing may be provided. The electrical connection may comprise a plug and socket connection.

The sensing electronics are configured to monitor the status of a circuit created between the bifilar wire, sensing electronics and power source where the two filaments of the bifilar wire are fused or joined together at a section along the length of the bifilar wire. The sensing electronics may be configured to monitor for an open circuit condition. This is suitable if the bifilar wire comprises two similar metals. Alternatively, the sensing electronics may be configured to monitor for absence of voltage. This is suitable if the bifilar wire comprises two filaments of dissimilar metals, creating a thermocouple voltage.

A second aspect of the invention provides a trigger system, comprising the trigger mechanism above and at least one receiver.

The at least one receiver may comprise an alarm which is activated on the receiver receiving a signal. The alarm may be silent. The at least one receiver may comprise at least one pager.

Alternatively, a trigger system may comprise the trigger mechanism above comprising an integral alarm.

A third aspect of the present invention provides a method of activating a trigger mechanism comprising sensing electronics, a power source and a length of bifilar wire comprising two electrically conductive filaments separated by an insulator, the bifilar wire having a first end in electrical connection with the sensing circuitry and a second end which is free, the method comprising the steps of:
laying the bifilar wire in a desired location; and
fusing together two filaments of the bifilar wire to create a circuit between the bifilar wire, sensing electronics and power source.

The method may further comprise the step of heating a section of the bifilar wire to fuse together the two filaments. The section of bifilar wire may be heated using a naked flame.

The step of laying the bifilar wire in a desired location may comprise unwinding it from a coil.

The method further may further comprise the step of monitoring the status of the circuit created between the bifilar wire, sensing electronics and power source. The method of monitoring the status of the circuit may comprise monitoring for an open circuit condition or an absence of voltage.

The method may further comprise the step of transmitting a signal on breakage of the circuit.

A fourth aspect of the present invention provides a use of a bifilar wire comprising two electrically conductive filaments separated by an insulator as a trip wire in a trigger mechanism.

The trigger mechanism may comprise sensing electronics and a power source in electrical connection with one end of the trip wire.

Preferred features of the second, third and fourth aspects of the invention may be as described above in connection with the first aspect.

Throughout the description and claims of this specification, the words "comprise" and "contain" and variations of the words, for example "comprising" and "comprises", mean "including but not limited to", and do not exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Other features of the present invention will become apparent from the following example. Generally speaking the invention extends to any novel one, or any novel combination, of the features disclosed in this specification (including any accompanying claims and drawings). Thus features, integers, characteristics, compounds, chemical moieties or groups described in conjunction with a particular aspect, embodiment or example of the invention are to be understood to be applicable to any other aspect, embodiment or example described herein unless incompatible therewith.

Moreover, unless stated otherwise, any feature disclosed herein may be replaced by an alternative feature serving the same or a similar purpose.

BRIEF DESCRIPTION OF THE DRAWINGS

The present invention will now be described by way of example only and with reference to the accompanying illustrative drawings, in which.

DESCRIPTION OF ILLUSTRATIVE EMBODIMENTS

Figure 1:
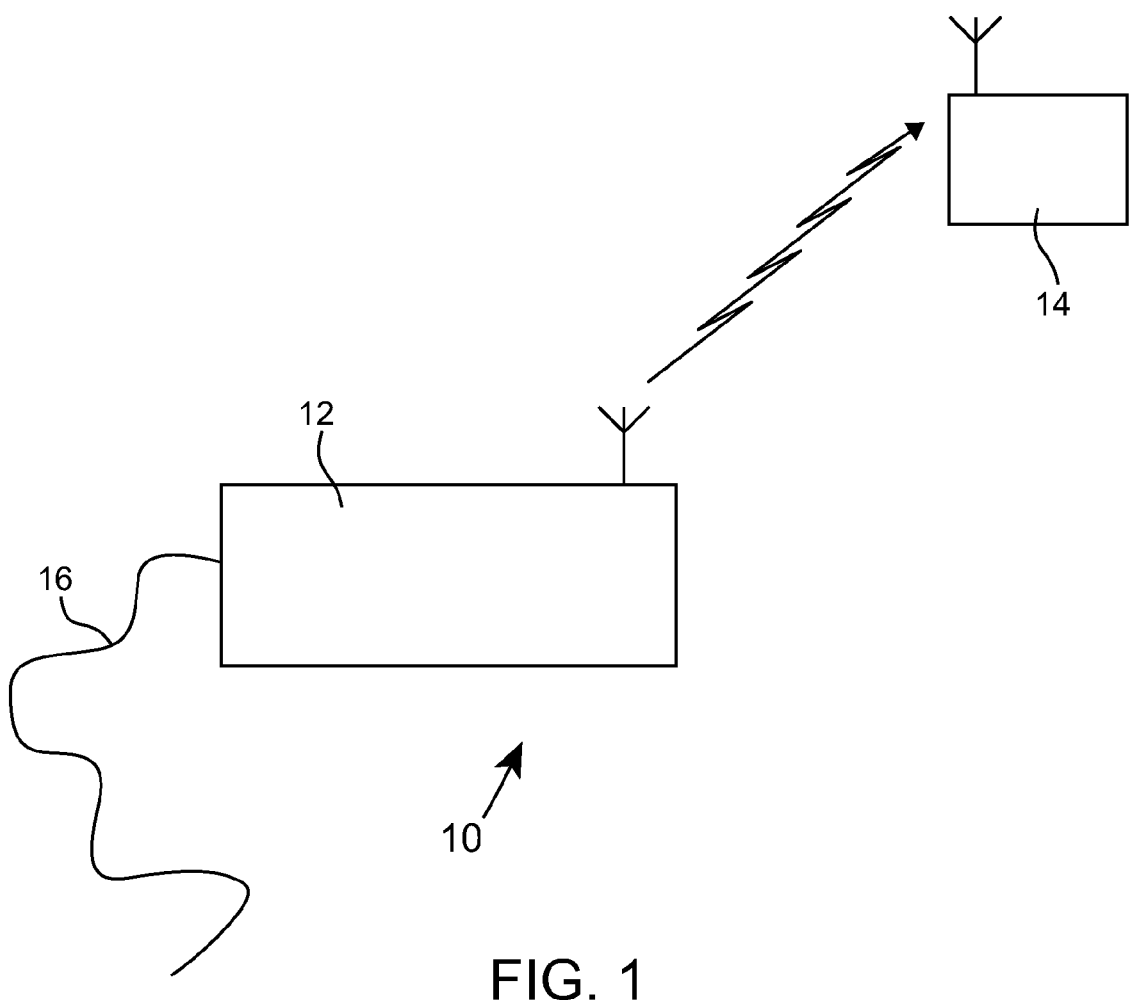
FIG. 1 is a diagrammatic side view of an embodiment of the invention.

FIG. 1 is a diagrammatic side view of an embodiment of the invention. The trigger mechanism 10 comprises a housing 12 which houses a coil of bifilar wire, a power source, sensing electronics and a transmitter. FIG. 1 also shows a receiver device 14, in this case a pager, which is capable of receiving a signal transmitted from the transmitter.

A length of bifilar wire 16 can be drawn out from the coil and some is shown extending from the housing 12 in FIG. 1. This wire comprises two filaments separated by an insulator. One end of the bifilar wire is in electrical connection with the sensing electronics and power supply within the housing, while the other end is free and can be drawn out from the housing.

Figure 2:
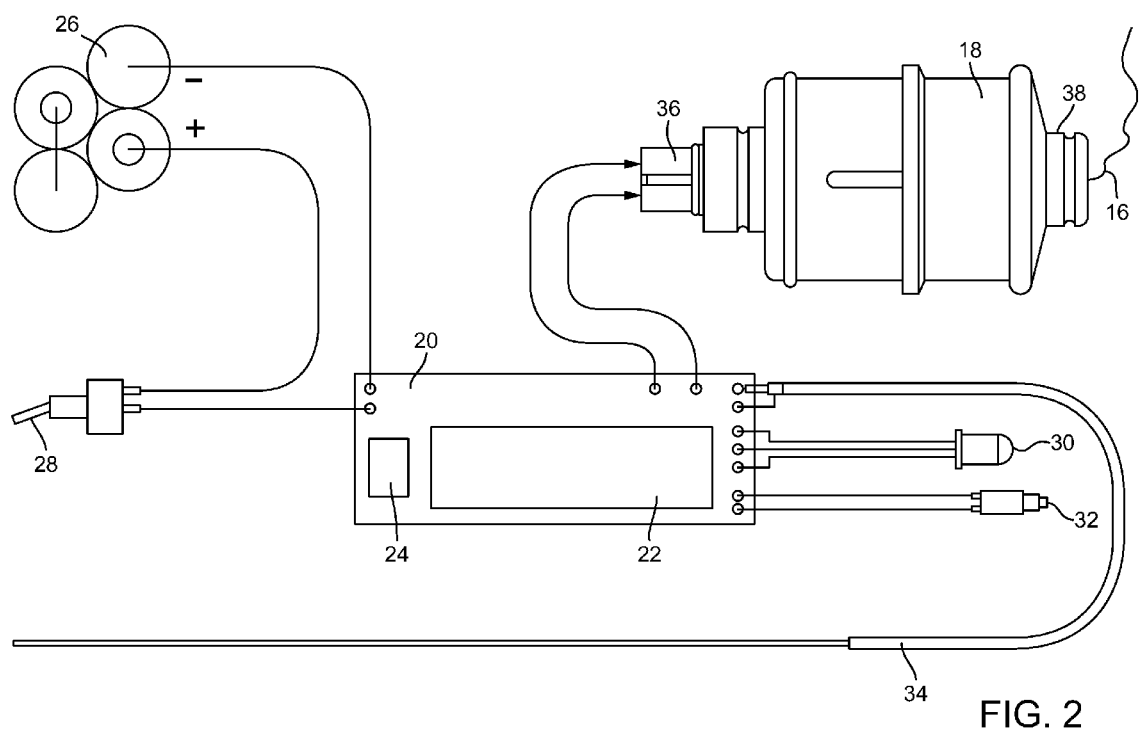
FIG. 2 is a schematic diagram showing the components housed within the trigger mechanism of FIG. 1.

FIG. 2 is a schematic diagram illustrating the components of the trigger mechanism that are housed within the housing. The components comprise a spool 18, which contains the coil of bifilar wire, which may exceed 1 km (=.0.62 mile) in length. A length of bifilar wire 16 is shown extending from the spool 18. Storing the coil of bifilar wire inside the spool has the benefit of eliminating rotation of the spool on drawing out of the wire. The spool 18 is connected to a printed circuit board (PCB) 20 which comprises sensing electronics 24 and a transmitter 22. Also within the housing and connected to the PCB are batteries 26, an activation switch 28, an LED 30, a test switch 32 and an aerial 34.

The spool 18 is electrically connected to the electronics in the housing via an electrical connection 36, comprising a plug and socket. In this embodiment, the spool is provided with an electrical socket, with the corresponding plug being mounted in the housing, although the opposite configuration is also possible. A length of bifilar wire is wound within the spool and one end is attached to the electrical connection 36. The electrical connection between the spool and housing is fully polarized, preventing the connection from being made the wrong way. The spool has a narrow neck 38, through which the free end of bifilar wire extends. This narrow neck is plugged with a foam or other resilient material, to prevent the wire from falling out of the spool and to maintain adequate friction when the free end of the wire is pulled.

The outer end of the coil of the bifilar wire is static and attached to electrical connection 36, while the inner end of the coil is free and extends through the neck 38 of the spool, enabling it to be pulled freely. This arrangement allows rapid deployment of the bifilar wire without tangling.

Figure 3:
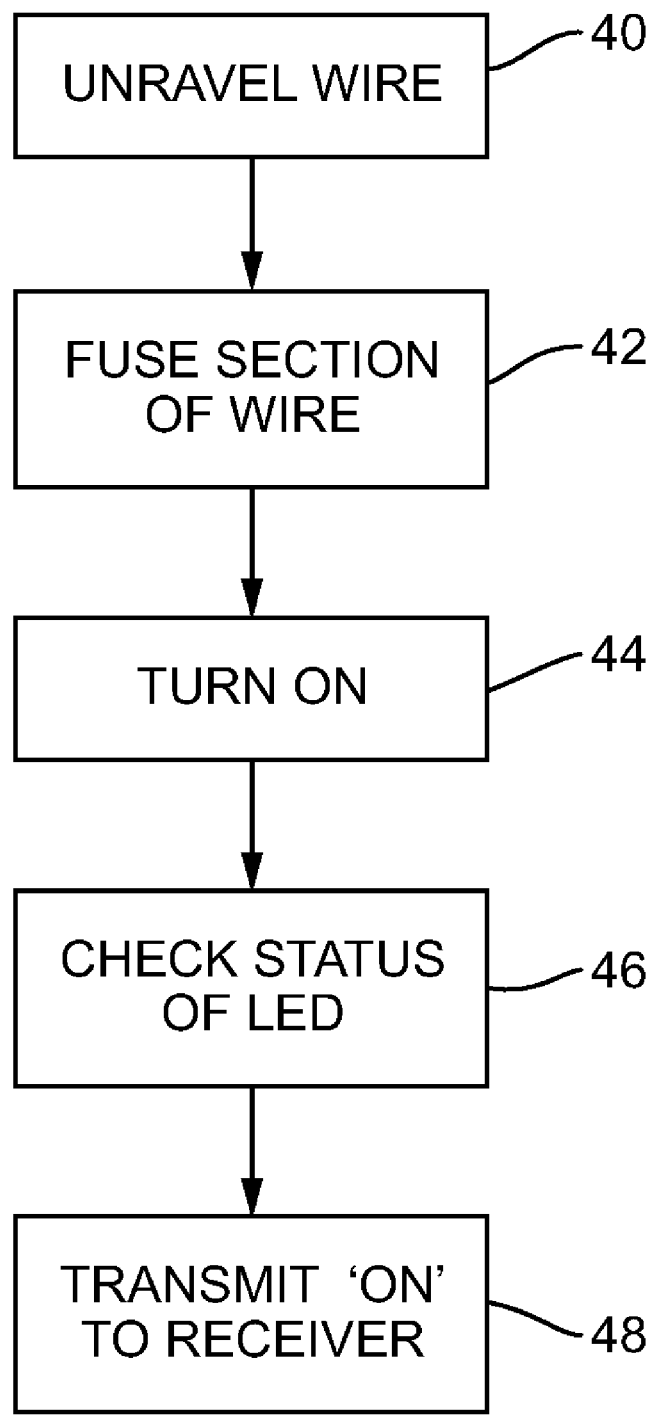
FIG. 3 is a flow diagram showing the set-up procedure of the trigger mechanism.

The trigger mechanism is set up as illustrated in the flow diagram of FIG. 3. The free end of the bifilar wire is drawn out from the coil and laid out as desired, for example along a boundary 40. Once a sufficient length of bifilar wire has been unraveled and arranged as desired, a section of the bifilar wire is fused 42. This section is preferably at or close to the free end of the length of bifilar wire. The section of wire is fused, for example by heating with a naked flame, such as a match or lighter. This causes the two individual filaments of the bifilar wire to fuse together, creating a circuit between the bifilar wire, sensing electronics and power source. The trigger mechanism is then switched on 44, using the activation switch. The activation switch allows the trigger mechanism to be turned on but does not provide an option for it to be switched off. The status of the trigger mechanism is checked 46 by monitoring the status LED. The status LED will illuminate for a set period of time, for example 30 seconds, in response to the activation switch being switched on. The LED is a bicolor LED that shows a first color for system activated and a second color for system failure. Finally, the transmitter will transmit a signal to the receiver 38 to confirm that the trigger mechanism is activated.

At any time, the status of the trigger mechanism can be checked by pressing the test switch; this will cause the status LED to light up for a set period of time, showing the status of the trigger mechanism.

Figure 4:
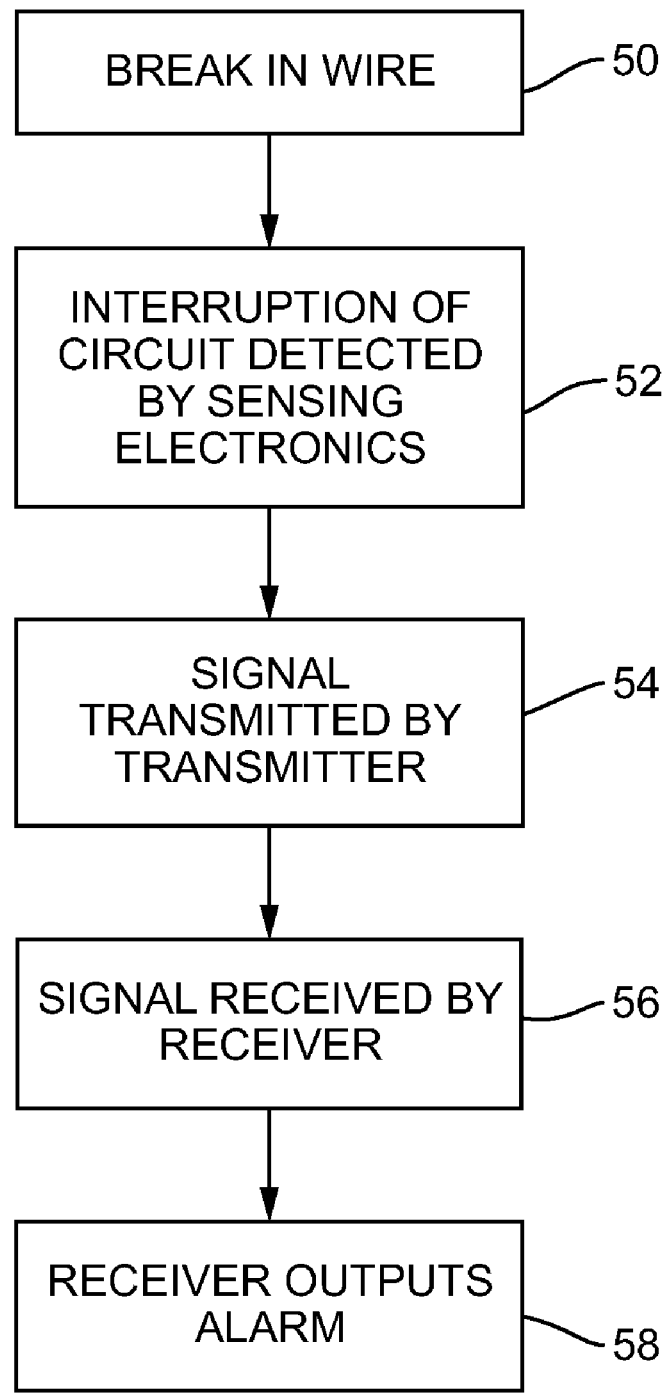
FIG. 4 is a flow diagram showing the sequence events that take place following breakage of the bifilar wire in the trigger mechanism.

Once the trigger mechanism has been set up and activated, any damage to the bifilar wire will result in the circuit being broken. FIG. 4 is a flow diagram illustrating the sequence of events which follows the breakage of the bifilar wire. The trigger mechanism is activated by a break in the bifilar wire 50. This can be caused by the wire being trodden on or otherwise broken by an intruder and causes the circuit to be broken. A break in the circuit is detected by sensing electronics 52 that monitors the status of the circuit. On breakage of the circuit, the sensing electronics will cause the transmitter to transmit a signal 54. This transmitted signal is received by one or more receivers 56. The receivers may comprise pagers or other suitable devices, such as mobile telephones. The one or more receivers output an alarm 58 to alert the operator that the trigger mechanism has been triggered. The alarm may be silent, for example a vibration.

The bifilar wire is very fine, in this embodiment 47 SWG (=0.002 inch=0.051 mm), which allows it to be easily hidden from view. This low visibility is further enhanced by using a dark color, such as green or black. Additionally, the bifilar wire has a matte finish, which enhances the low visibility. The use of a very fine wire not only allows the wire to be easily hidden but also causes it to break very easily. The low breaking strain has the advantage that the wire is not required to be kept under tension, thereby making detection extremely difficult. Furthermore, such a fine wire enables a light weight device to be produced. In different applications, use of a thicker wire may be desired, for example to detect vehicles, such as tanks, crossing a boundary.

The bifilar wire used in this embodiment has two copper filaments separated by insulating varnish. The combination of a very fine wire, the use of a material for the filaments with a low melting point and a vaporizable insulation ensures that the filaments can easily be fused together with a naked flame.

The trigger mechanism of the present invention has the advantage of being light weight, low visibility and capable of rapid deployment. The fact that the bifilar wire is not required to be under tension makes it especially difficult to detect. The trigger mechanism is very versatile and can be deployed over ground, buried or submersed.

What is claimed is:

1. A trigger mechanism comprising:
   sensing electronics;
   a power source;
   a length of bifilar wire comprising two electrically conductive filaments separated by an insulator, the bifilar wire having a first end in electrical connection with the sensing electronics and the power source and a second end which is free;
   wherein the sensing electronics are configured to monitor the status of a circuit created between the bifilar wire, sensing electronics and power source when two filaments of the bifilar wire are fused or joined together at a section along the length of the bifilar wire.

2. The trigger mechanism according to claim 1, wherein the bifilar wire is wound in a coil.

3. The trigger mechanism according to claim 1 wherein the two filaments in the bifilar wire comprise metallic filaments.

4. The trigger mechanism according to claim 3, wherein the two filaments comprise similar metals.

5. The trigger mechanism according to claim 3 wherein the two filaments comprise dissimilar metals.

6. The trigger mechanism according to claim 1, wherein at least one filament of the bifilar wire comprise copper.

7. The trigger mechanism according to claim 1, wherein the two filaments of the bifilar wire are capable of being fused together by a direct heat source.

8. The trigger mechanism according to claim 7, wherein the direct heat source comprises a naked flame.

9. The trigger mechanism according to claim 1 wherein the two filaments of the bifilar wire are capable of being joined together by mechanical means.

10. The trigger mechanism according to claim 1, wherein the two filaments are separated by insulation.

11. The trigger mechanism according to claim 10 wherein the insulation comprises vaporizable insulation.

12. The trigger mechanism according to claim 10, wherein the insulation comprises shellac, polyurethane or other insulating varnish.

13. The trigger mechanism according to claim 1, wherein the bifilar wire has a gauge of 10 swg or above.

14. The trigger mechanism according to claim 1, wherein the bifilar wire has a gauge of 30 SWG or above.

15. The trigger mechanism according to claim 1, wherein the bifilar wire has a gauge of 30-50 SWG.

16. The trigger mechanism according to claim 1, wherein the bifilar wire has a gauge of 47 SWG.

17. The trigger mechanism according to claim 1, wherein the bifilar wire has a length of at least 1 km.

18. The trigger mechanism according to claim 1, further comprising a transmitter for transmitting a signal on breakage of the circuit between the bifilar wire, sensing electronics and power source.

19. The trigger system comprising the trigger mechanism of claim 18 and at least one receiver.

20. The trigger system according to claim 19, wherein the at least one receiver comprises an alarm that is activated on the receiver receiving a signal.

21. The trigger system according to claim 20, wherein the alarm is silent.

22. The trigger system according to claim 20, wherein the at least one receiver comprises at least one pager.

23. The trigger mechanism according to claim 1, further comprising a housing, wherein the housing houses the power source and sensing electronics.

24. The trigger mechanism according to claim 23, wherein the housing further houses a spool for the bifilar wire.

25. The trigger mechanism according to claim 24, comprising an electrical connection between the spool and housing.

26. The trigger mechanism according to claim 25, wherein the electrical connection comprises a plug and socket connection.

27. The trigger mechanism according to claim 1 wherein the bifilar wire is stored in a coil and wherein the outer end is static and the inner end is free.

28. A method of activating a trigger mechanism comprising sensing electronics, a power source and a length of bifilar wire comprising two electrically conductive filaments separated by an insulator, the bifilar wire having a first end in electrical connection with the sensing circuitry and a second end that is free, the method comprising the steps of:
   laying the bifilar wire in a desired location; and
   fusing or joining together two filaments of the bifilar wire to create a circuit between the bifilar wire, sensing electronics and power source.

29. The method according to claim 28, comprising the step of heating a section of the bifilar wire to fuse together the two filaments.

30. The method according to claim 29, wherein the section of bifilar wire is heated using a naked flame.

31. The method according to claim 28, wherein the step of laying the bifilar wire in a desired location comprises unwinding it from a coil.

32. The method according to claim 28, wherein the method further comprises the step of monitoring the status of the circuit created between the bifilar wire, sensing electronics and power source.

33. The method according to claim 32, wherein the step of monitoring the status of the circuit comprises monitoring for an open circuit condition.

34. The method according to claim 32, wherein the step of monitoring the status of the circuit comprises monitoring for absence of voltage.

35. The method according to claim 32, wherein the method further comprises the step of transmitting a signal on breakage of the circuit.

* * * * *